United States Patent
Choi et al.

(10) Patent No.: US 12,073,896 B2
(45) Date of Patent: Aug. 27, 2024

(54) MEMORY SYSTEM AND OPERATING METHOD OF THE MEMORY SYSTEM

(71) Applicant: SK hynix Inc., Icheon-si (KR)

(72) Inventors: Gil Bok Choi, Icheon-si (KR); Moon Sik Seo, Icheon-si (KR); Dae Hwan Yun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 127 days.

(21) Appl. No.: 17/890,784

(22) Filed: Aug. 18, 2022

(65) Prior Publication Data

US 2023/0307073 A1  Sep. 28, 2023

(30) Foreign Application Priority Data

Mar. 23, 2022 (KR) .................. 10-2022-0035814

(51) Int. Cl.
| | |
|---|---|
| *G11C 16/06* | (2006.01) |
| *G11C 16/04* | (2006.01) |
| *G11C 16/10* | (2006.01) |
| *G11C 16/16* | (2006.01) |
| *G11C 16/34* | (2006.01) |

(52) U.S. Cl.
CPC ...... *G11C 16/3495* (2013.01); *G11C 16/0483* (2013.01); *G11C 16/10* (2013.01); *G11C 16/16* (2013.01)

(58) Field of Classification Search
CPC . G11C 16/3495; G11C 16/0483; G11C 16/10; G11C 16/16
USPC .................................................. 365/185.09
See application file for complete search history.

(56) References Cited

U.S. PATENT DOCUMENTS

| | | | | |
|---|---|---|---|---|
| 5,576,992 | A * | 11/1996 | Mehrad ............. | G11C 16/3404 365/185.24 |
| 6,426,898 | B1 * | 7/2002 | Mihnea ............. | G11C 16/3445 365/185.11 |
| 7,864,588 | B2 * | 1/2011 | Betser .................... | G11C 16/28 365/207 |
| 8,947,940 | B2 * | 2/2015 | Mu ....................... | G11C 16/349 365/185.23 |
| 10,600,486 | B2 * | 3/2020 | Yun ........................ | G11C 16/04 |
| 10,777,285 | B2 * | 9/2020 | Jung .................. | G11C 16/3427 |
| 10,803,956 | B2 * | 10/2020 | Kim ....................... | G11C 16/26 |

(Continued)

FOREIGN PATENT DOCUMENTS

| KR | 1020160124434 A | 10/2016 |
|---|---|---|
| KR | 1020170065726 A | 6/2017 |

*Primary Examiner* — Viet Q Nguyen
(74) *Attorney, Agent, or Firm* — William Park & Associates Ltd.

(57) ABSTRACT

A memory system and a method of operating the memory system are provided. The memory system includes a plurality of semiconductor memory devices each of which includes a plurality of memory blocks. The memory system also includes a controller configured to control the plurality of semiconductor memory devices to perform a program operation, a read operation, and an operation of removing a hole in a space region on a target memory block of the plurality of memory blocks. The controller controls the plurality of semiconductor memory devices to perform the operation of removing the hole in the space region on the target memory block when an erase count of the target memory block of the plurality of memory blocks is greater than a set value.

16 Claims, 9 Drawing Sheets

(56) References Cited

U.S. PATENT DOCUMENTS

| | | | |
|---|---|---|---|
| 11,694,790 B2* | 7/2023 | Uhlemann | G06N 20/00 |
| | | | 706/12 |
| 11,915,768 B2* | 2/2024 | Harari | G11C 11/5642 |
| 2010/0165772 A1* | 7/2010 | Avci | G11C 11/404 |
| | | | 365/189.011 |
| 2020/0194081 A1* | 6/2020 | Yun | G11C 16/04 |

* cited by examiner

MEMORY SYSTEM AND OPERATING METHOD OF THE MEMORY SYSTEM

CROSS-REFERENCE TO RELATED APPLICATION

The present application claims priority under 35 U.S.C. § 119(a) to Korean patent application number 10-2022-0035814, filed on Mar. 23, 2022, in the Korean Intellectual Property Office, the entire disclosure of which is incorporated herein by reference.

BACKGROUND

1. Technical Field

Various embodiments of the present disclosure generally relate to an electronic device, and more particularly, to a memory system and a method of operating the memory system.

2. Related Art

Recently, a paradigm with respect to a computing environment has changed to ubiquitous computing which is capable of using a computer system virtually anytime and anywhere. Accordingly, use of portable electronic devices, such as a mobile phone, a digital camera, and a laptop, has been rapidly increasing. The portable electronic devices as described above may generally use memory systems employing memory devices, that is, data storage devices. The data storage device may be used as a main memory device or an auxiliary memory device of the portable electronic device.

The data storage device employing the memory device does not include a mechanical driver, and thus may have excellent stability and durability with an extremely high information access speed and low power consumption. Examples of a memory system having the above-stated characteristics are a data storage device including a Universal Serial Bus (USB) memory device, a memory card having various interfaces, and a Solid-State Drive (SSD).

SUMMARY

According to an embodiment, a memory system may include a plurality of semiconductor memory devices each of which includes a plurality of memory blocks. The memory system may also include a controller configured to control the plurality of semiconductor memory devices to perform a program operation, a read operation, and an operation of removing a hole in a space region on a target memory block of the plurality of memory blocks. The controller controls the plurality of semiconductor memory devices to perform the operation of removing the hole in the space region on the target memory block when an erase count of the target memory block of the plurality of memory blocks is greater than a set value.

According to an embodiment, a memory system may include a memory device including a plurality of memory blocks. The memory system may also include a controller configured to control the memory device to perform a program operation, a read operation, and an operation of removing a hole in a space region on the plurality of memory blocks. The controller includes an erase counter for counting an erase count of each of the plurality of memory blocks and controls the memory device to perform the operation of removing the hole in the space region on a target memory block for which the erase count counted by the erase counter is greater than a set value.

According to the present teachings, a method of operating a memory system may include counting an erase count for each memory block of a plurality of memory blocks. The method may also include designating, as a target memory block, a memory block among the plurality of memory blocks for which the counted erase count is greater than a set value. The method may further include performing an operation of removing a hole in a space region on the target memory block.

DETAILED DESCRIPTION

Specific structural or functional descriptions disclosed herein are merely illustrative for the purpose of describing embodiments according to the concept of the present disclosure. Embodiments according to the concept of the present disclosure may be implemented in various forms and should not be construed as being limited to the specific embodiments set forth herein.

Various embodiments are directed to a memory system having improved threshold voltage characteristics of memory cells by removing a hole present in a region between the memory cells and a method of operating the memory system.

Figure 1:
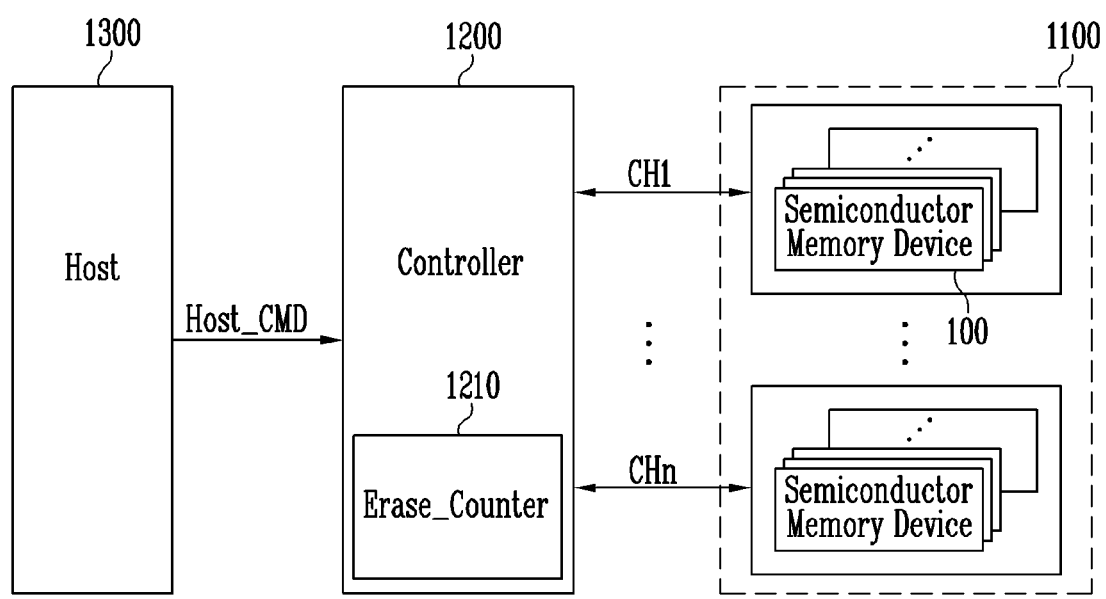
FIG. 1 is a block diagram illustrating a memory system according to an embodiment.

FIG. 1 is a block diagram illustrating a memory system 1000 according to an embodiment.

Referring to FIG. 1, the memory system 1000 may include a memory device 1100, a controller 1200, and a host 1300. The memory device 1100 may include a plurality of semiconductor memory devices 100. The plurality of semiconductor memory devices 100 may be divided into a plurality of groups. According to an embodiment shown in FIG. 1, it is illustrated and described that the host 1300 is included in the memory system 1000. However, the memory system 1000 may also be configured to include only the controller 1200 and the memory device 1100, and the host 1300 may be disposed external to the memory system 1000.

FIG. 1 illustrates that the plurality of groups in the memory device 1100 communicate with the controller 1200 through first to nth channels CH1 to CHn, respectively. Each of the semiconductor memory devices 100 is described below with reference to FIG. 2.

Each of the plurality of groups that includes the semiconductor memory devices 100 may be configured to communicate with the controller 1200 through a single common channel. The controller 1200 may be configured to control the plurality of semiconductor memory devices 100 of the memory device 1100 through the plurality of channels CH1 to CHn.

The controller 1200 may be coupled between the host 1300 and the memory device 1100. The controller 1200 may be configured to access the memory device 1100 in response to a request from the host 1300. For example, the controller 1200 may be configured to control read, write, erase, and background operations of the memory device 1100 in response to a host command Host_CMD received from the host 1300. During the write operation, the host 1300 may transmit data and an address together with the host command Host_CMD. During the read operation, the host 1300 may transmit an address together with the host command Host_CMD. The controller 1200 may be configured to provide an interface between the memory device 1100 and the host 1300. The controller 1200 may be configured to run firmware for controlling the memory device 1100. For an embodiment, the controller 1200 represents a controller circuit.

The controller 1200 may be configured to include an erase counter 1210. The erase counter 1210 may count an erase count of a plurality of memory blocks included in each of the plurality of semiconductor memory devices 100. For example, the erase count for a memory block is the counted number of times an erase operation has been performed on the memory block. For an embodiment, the erase counter 1210 represents an erase counter circuit. The controller 1200 may control the memory device 1100 to perform an operation of removing a hole in a space region on a memory block for which the erase count that is counted by the erase counter 1210 is greater than a set count.

The plurality of semiconductor memory devices 100 included in the memory device 1100 may remove the hole by introducing an electron into the space region between memory cells by applying a set voltage to all word lines of the memory block for which erase count is greater than the set count during the operation of removing the hole in the space region.

According to an embodiment, it is described that the erase counter 1210 is included in the controller 1200. However, the erase counter 1210 may be configured to be included in each of the plurality of semiconductor memory devices 100. When the erase counter 1210 is included in each of the plurality of semiconductor memory devices 100, an erase count of each of the plurality of memory blocks in each of the plurality of semiconductor memory devices 100 may be counted by the erase counter 1210 and when the counted erase count of a memory block is greater than a set count, a process of removing a hole in a space region may be performed on the corresponding memory block.

The host 1300 may include portable electronic devices such as personal digital assistants (PDAs), portable multimedia players (PMPs), MP3 players, cameras, camcorders, or cellular phones. The host 1300 may request a write operation, a read operation, and an erase operation of the memory system 1000 through the host command Host_CMD. The host 1300 may transmit the host command Host_CMD corresponding to a write command, data, and an address to the controller 1200 to perform the write operation of the memory device 1100 and the host 1300 may transmit the host command Host_CMD corresponding to a read command and an address to the controller 1200 to perform the read operation of the memory device 1100. The address may be a logical address.

The controller 1200 and the memory device 1100 may be integrated into a single semiconductor device. According to an embodiment, the controller 1200 and the memory device 1100 may be integrated into a single semiconductor device to form a memory card. For example, the controller 1200 and the memory device 1100 may be integrated into a single semiconductor device to form a memory card such as a personal computer memory card international association (PCMCIA), a compact flash (CF) card, a smart media card (SM or SMC), a memory stick, a multimedia card (MMC, RS-MMC, or MMCmicro), an SD card (SD, miniSD, microSD, or SDHC), and a universal flash storage (UFS).

The controller 1200 and the memory device 1100 may be integrated into a single semiconductor device to form a solid-state drive (SSD). The SSD may include a storage device configured to store data in the semiconductor memory device 100.

In another example, the memory system 1000 may be provided as one of various elements of an electronic device such as a computer, an ultra-mobile PC (UMPC), a workstation, a netbook, personal digital assistants (PDAs), a portable computer, a web tablet, a wireless phone, a mobile phone, a smartphone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or one of various elements for forming a computing system.

In an embodiment, the memory device 1100 or the memory system 1000 may be embedded in packages in various forms. For example, the memory device 1100 or the memory system 1000 may be embedded in packages such as a Package on Package (PoP), Ball Grid Arrays (BGAs), Chip Scale Packages (CSPs), a Plastic Leaded Chip Carrier (PLCC), a Plastic Dual In-line Package (PDIP), a Die in Waffle Pack, a Die in Wafer Form, a Chip On Board (COB), a Ceramic Dual In-line Package (CERDIP), a Plastic Metric Quad Flat Pack (PMQFP), a Thin Quad Flat Pack (TQFP), a Small Outline Integrated Circuit (SOIC), a Shrink Small Outline Package (SSOP), a Thin Small Outline Package (TSOP), a System In Package (SIP), a Multi-Chip Package (MCP), a Wafer-level Fabricated Package (WFP), or a Wafer-level Processed Stack Package (WSP).

Figure 2:
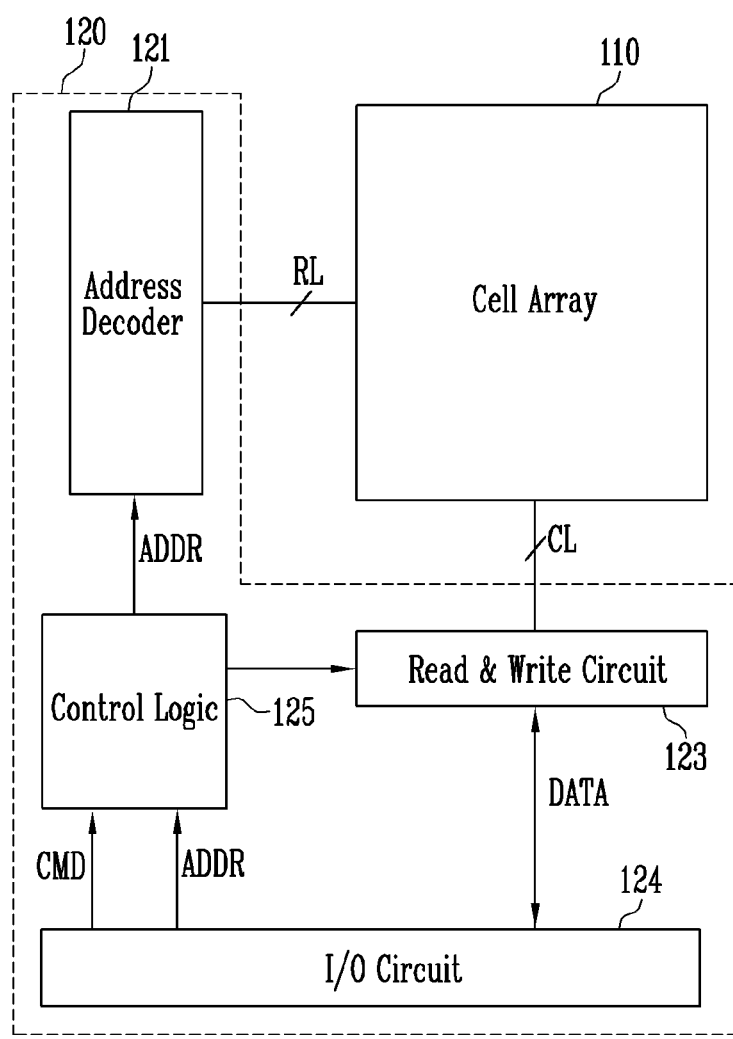
FIG. 2 is a block diagram illustrating a semiconductor memory device shown in FIG. 1.

FIG. 2 is a block diagram illustrating the semiconductor memory device 100 shown in FIG. 1.

Referring to FIG. 2, the semiconductor memory device 100 may include a cell array 110 and a peripheral circuit 120. The semiconductor memory device 100 may be a nonvolatile memory device. For example, the semiconductor memory device 100 may be a flash memory device.

The cell array 110 may be coupled to an address decoder 121 through row lines RL and to a read and write circuit 123 through column lines CL. The row lines RL may be word lines and the column lines CL may be bit lines. However, the terms "word lines" and "bit lines" may be relative to each other. In other words, row lines may be the bit lines and column lines may be the word lines.

The cell array 110 may include a plurality of memory strings and the plurality of memory strings may be arranged in a horizontal direction or a vertical direction to a substrate. In addition, the cell array 110 may include a plurality of memory blocks, and each of the plurality of memory blocks may include a plurality of pages. For example, the semiconductor memory device 100 may perform an erase operation in units of memory blocks and a program operation or a read operation in units of pages.

The peripheral circuit 120 may include the address decoder 121, the read and write circuit 123, an input/output circuit 124, and control logic 125.

The control logic 125 may be coupled to the address decoder 121, the read and write circuit 123 and the input/output circuit 124. The control logic 125 may receive a command CMD and an address ADDR from the input/output circuit 124 and control the address decoder 121 and the read and write circuit 123 to perform an internal operation in response to the received command CMD. The control logic 125 may be implemented as hardware, software, or a combination of hardware and software. For example, the control logic 125 may be a control logic circuit operating in accordance with an algorithm and/or a processor executing control logic code.

The address decoder 121 may be coupled to the cell array 110 through the row lines RL. For example, the address decoder 121 may be coupled to the cell array 110 through a word line, a dummy word line, a source select line, and a drain select line. In addition, the address decoder 121 may be configured to control the row lines RL in response to control of the control logic 125. Therefore, the address decoder 121 may receive the address ADDR from the control logic 125 and select one of the memory blocks of the cell array 110 in response to the received address ADDR.

The program operation and the read operation of the semiconductor memory device 100 may be performed in units of pages. Accordingly, during the program operation and the read operation, the address ADDR may include a block address and a row address. The address decoder 121 may decode the block address included in the received address ADDR and select one of the memory blocks according to the decoded block address. The address decoder 121 may decode the row address included in the received address ADDR and select one of the pages of the selected memory block according to the decoded row address.

The erase operation of the semiconductor memory device 100 may be performed in units of memory blocks. Accordingly, during the erase operation, the address ADDR may include a block address. The address decoder 121 may decode the block address and select one of the memory blocks in response to the decoded block address.

The read and write circuit 123 may be coupled to the cell array 110 through the column lines CL. During the program operation, the read and write circuit 123 may transfer data DATA received from the input/output circuit 124 to the column lines CL, and memory cells of the selected page may be programmed with the transferred data DATA. The data DATA may be multi-bit data to be programmed to memory cells, respectively. During the read operation, the read and write circuit 123 may read the data DATA from the memory cells of the selected page through the column lines CL and output the read data DATA to the input/output circuit 124. During the erase operation, the read and write circuit 123 may float the column lines CL. The program operation and the erase operation may include a verify operation, and the verify operation may be performed in a similar manner to the read operation.

According to the above-described configuration, the memory cells may be programmed by a Single-Level Cell (SLC) method or a Multi-Level Cell (MLC) method. In addition, the control logic 125 may control the semiconductor memory device 100 to perform a program operation by a single-step method or a multi-step method. According to the multi-step method, a program operation may be performed a plurality of times to configure a desired program state. Examples of the multi-step method include a pre-/main program method, a reprogram method, and a shadow program method. After configuring a program state by a one-shot method, a reprogram may be further performed to decrease a width of a threshold voltage distribution.

The control logic 125 may control the address decoder 121 and the read and write circuit 123 to perform the operation of removing the hole in the space region. The address decoder 121 may apply a set voltage to all word lines of the selected memory block in response to the control of the control logic 125 during the operation of removing a hole in the space region. The set voltage may be a voltage having the same voltage level as a program voltage applied to a selected word line during the program operation. The read and write circuit 123 may apply a ground voltage to bit lines in response to the control of the control logic 125 during the operation of removing the hole in the space region. In addition, the ground voltage may be applied to a source line of the cell array 110 during the operation of removing the hole in the space region.

Holes present in a space region between memory cells may be removed by the above-described operation of removing a hole in the space region. Accordingly, a charge loss by lateral spreading may be minimized and data retention characteristics may be improved.

Figure 3:
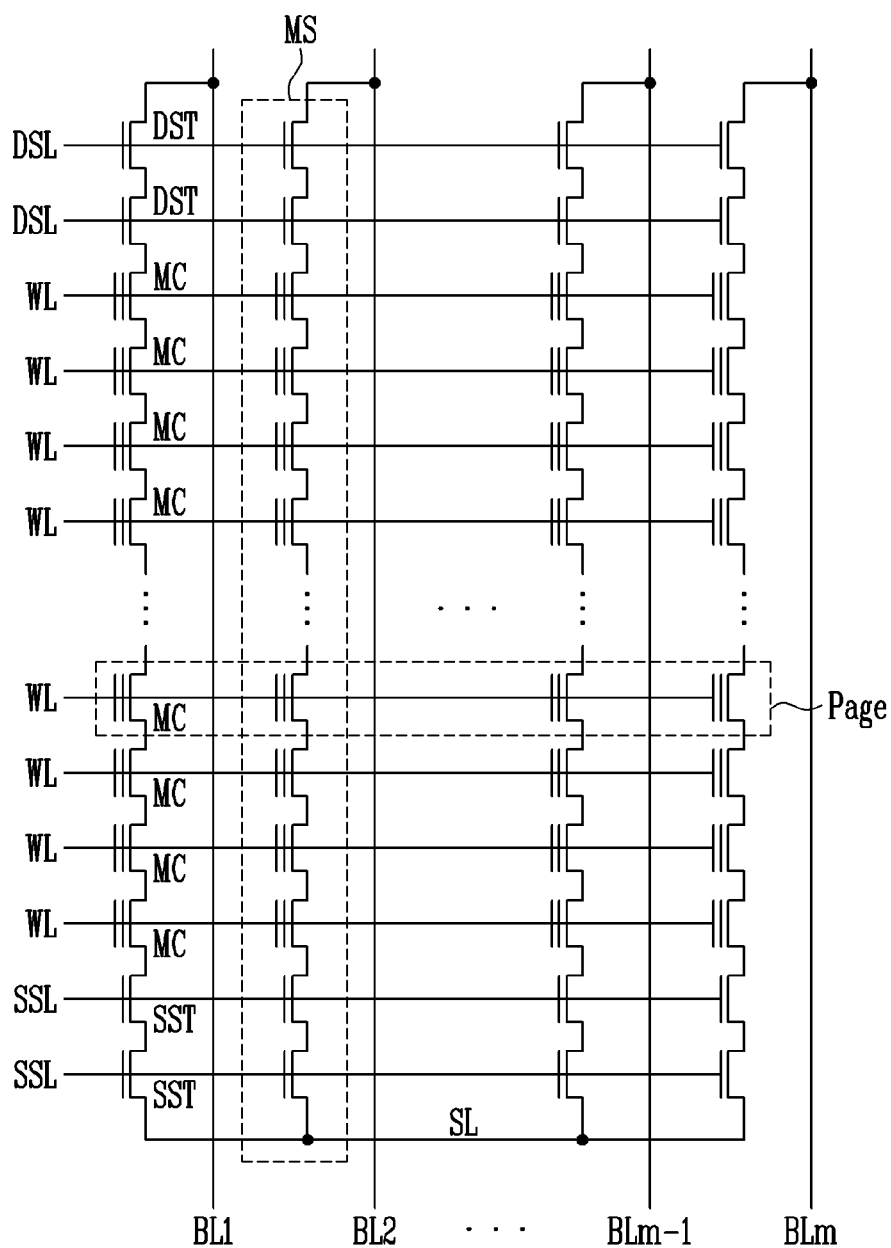
FIGS. 3 to 5 are circuit diagrams illustrating a cell array structure of a semiconductor memory device according to an embodiment.
Figure 4:
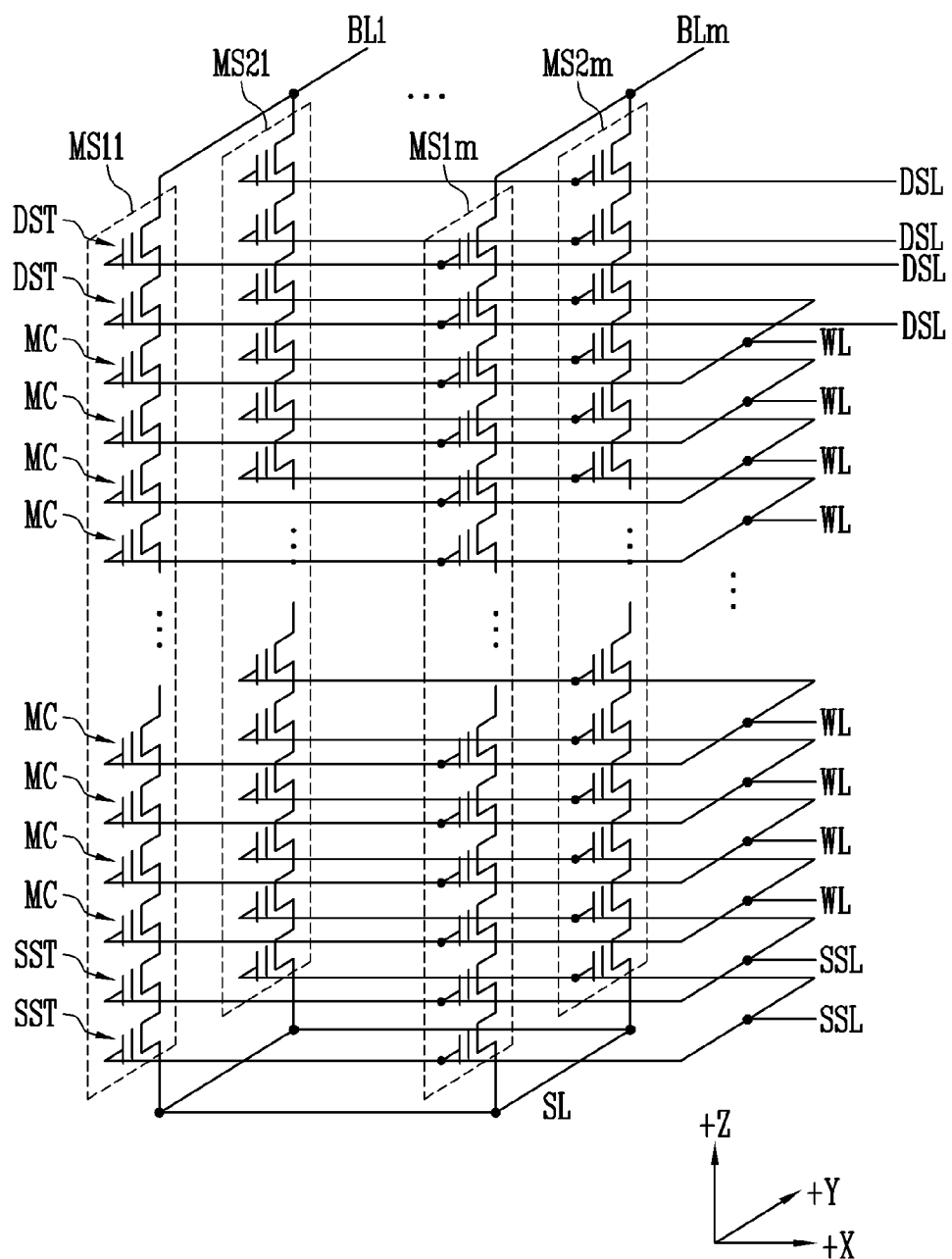
Figure 5:
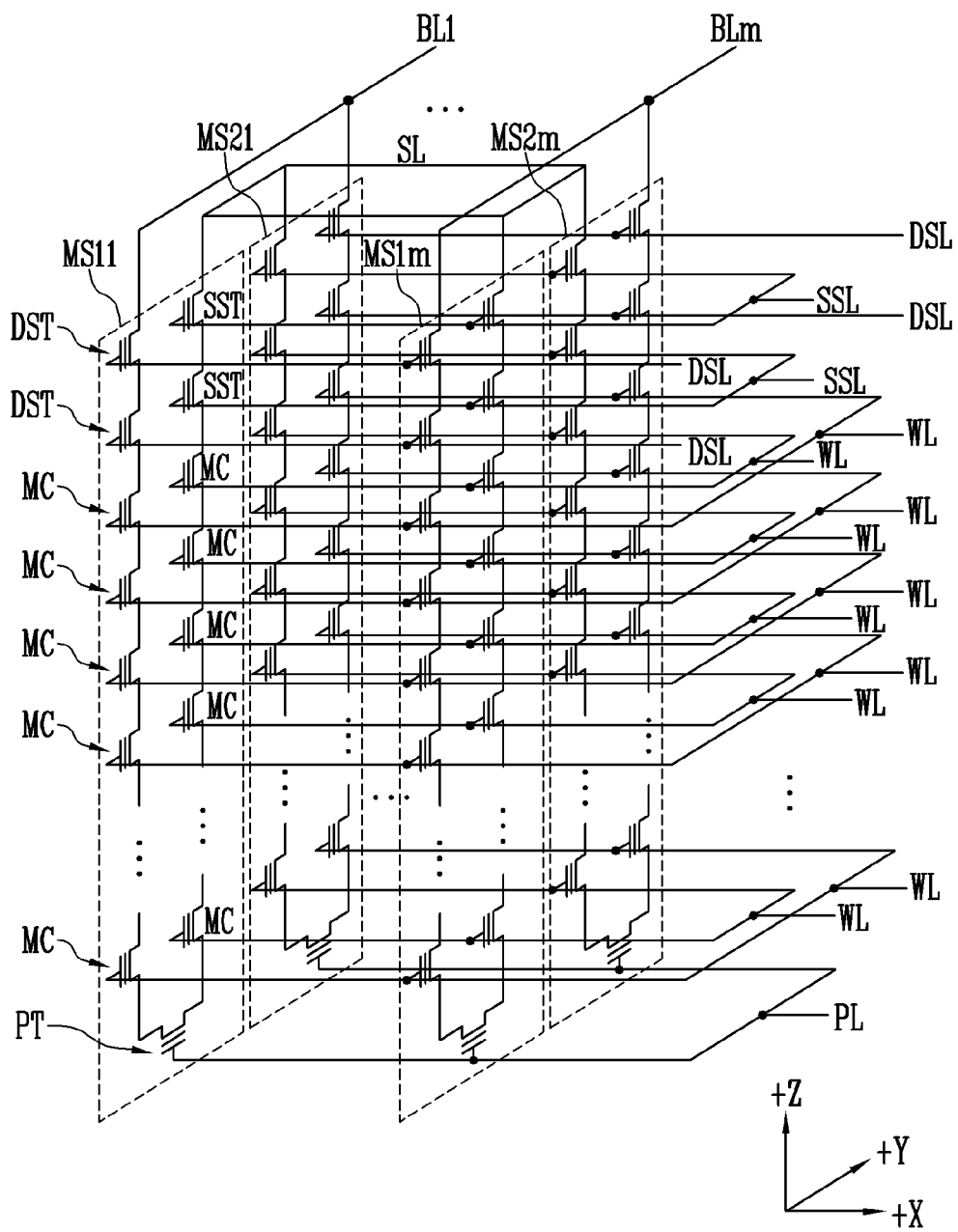

FIGS. 3 to 5 are circuit diagrams illustrating a cell array structure of a semiconductor memory device according to an embodiment.

Referring to FIG. 3, the cell array may include a plurality of memory blocks BLK, and each of the memory blocks BLK may include a plurality of memory strings MS. In addition, the plurality of memory strings MS may be coupled between bit lines BL1 to BLm and a source line SL.

Each of the memory strings MS may include at least one drain select transistor DST, a plurality of memory cells MC, and at least one source select transistor SST coupled in series with each other. In FIGS. 3 to 5, m is an integer of 2 or more. Although not illustrated in FIGS. 3 to 5, each of the memory strings MS may further include a dummy memory cell located between the source select transistor SST and the memory cells MC or between the drain select transistor DST and the memory cells MC. In addition, the memory cells MC included in a single memory string MS may be located in substantially the same level or in different levels.

Gate electrodes of the memory cells MC may be coupled to word lines WL. Word line voltages (such as a program voltage, a pass voltage, and a read voltage) used to drive the word lines WL may be applied to each of the word lines WL. Gate electrodes of the drain select transistors DST may be coupled to a drain select line DSL. Gate electrodes of the source select transistors SST may be coupled to a source select line SSL.

Each of the memory cells MC may include a channel layer, a memory layer, and a gate electrode. The memory layer may be for storing data, and include a tunnel insulating layer, a data storage layer, and a charge blocking layer.

When each of the memory strings MS includes the dummy memory cell, the dummy memory cell may have substantially the same structure as the memory cells MC and include a memory layer.

Each of the source and drain select transistors SST and DST may include a channel layer, a gate insulating layer, and a gate electrode. In addition, each of the source and drain select transistors SST and DST may have substantially the same structure as the memory cells and include a memory layer instead of the gate insulating layer. In other words, each of the source and drain select transistors SST and DST may include the channel layer, the memory layer, and the gate electrode, and use the memory layer as the gate insulating layer.

According to the above-described structure, the memory cells MC coupled to the same word line WL and simultaneously programmed may constitute one page Page, and one memory block BLK may include a plurality of pages.

Referring to FIG. 4, the memory block BLK may include a plurality of memory strings MS11 to MS1$m$ and MS21 to MS2$m$ coupled between the bit lines BL1 to BL$m$ and the source line SL. In addition, each of the memory strings MS11 to MS1$m$ and MS21 to MS2$m$ may extend in a +Z direction. Here, the +Z direction may be a direction in which the memory cells MC are stacked. Here, m is an integer of 2 or more.

Each of the memory strings MS11 to MS1$m$ and MS21 to MS2$m$ may include at least one source select transistor SST, the plurality of memory cells MC, and at least one drain select transistor DST that are sequentially stacked on each other.

The source select transistors SST included in a single memory string among the memory strings MS11 to MS1$m$ and MS21 to MS2$m$ may be coupled in series between the memory cell MC and the source line SL. In addition, the source select transistors SST in the same level may be coupled to the same source select line SSL.

The memory cells MC included in a single memory string among the memory strings MS11 to MS1$m$ and MS21 to MS2$m$ may be coupled in series between the source select transistor SST and the drain select transistor DST. In addition, the memory cells MC in the same level may be coupled to the same word line WL.

The drain select transistors DST included in a single memory string among the memory strings MS11 to MS1$m$ and MS21 to MS2$m$ may be coupled in series between each of the bit lines BL1 to BL$m$ and the memory cell MC. The drain select transistors DST in the same level among the drain select transistors DST of the memory strings MS11 to MS1$m$ and MS21 to MS2$m$ arranged in the same row (in a +X direction) may be coupled to the same drain select line DSL. In addition, the drain select transistors DST arranged in different rows (in the +X direction) may be coupled to the different drain select lines DSL from each other.

Referring to FIG. 5, the memory block BLK may include the plurality of memory strings MS11 to MS1$m$ and MS21 to MS2$m$. Each of the memory strings MS11 to MS1$m$ and MS21 to MS2$m$ may include at least one source select transistor SST, the plurality of memory cells MC, at least one pipe transistor PT, the plurality of memory cells MC, and at least one drain select transistor DST coupled in series to each other. Each of the memory strings MS11 to MS1$m$ and MS21 to MS2$m$ may be arranged in a shape of 'U'.

The pipe transistor PT may couple the memory cells MC at a drain side and the memory cells MC at a source side. In addition, a gate of the pipe transistor PT of each of the memory strings MS11 to MS1$m$ and MS21 to MS2$m$ may be coupled to a pipe line PL. Structures other than the above-described structures described with reference to FIG. 5 are similar to those described above with reference to FIG. 4. Therefore, repetitive descriptions are omitted.

Figure 6:
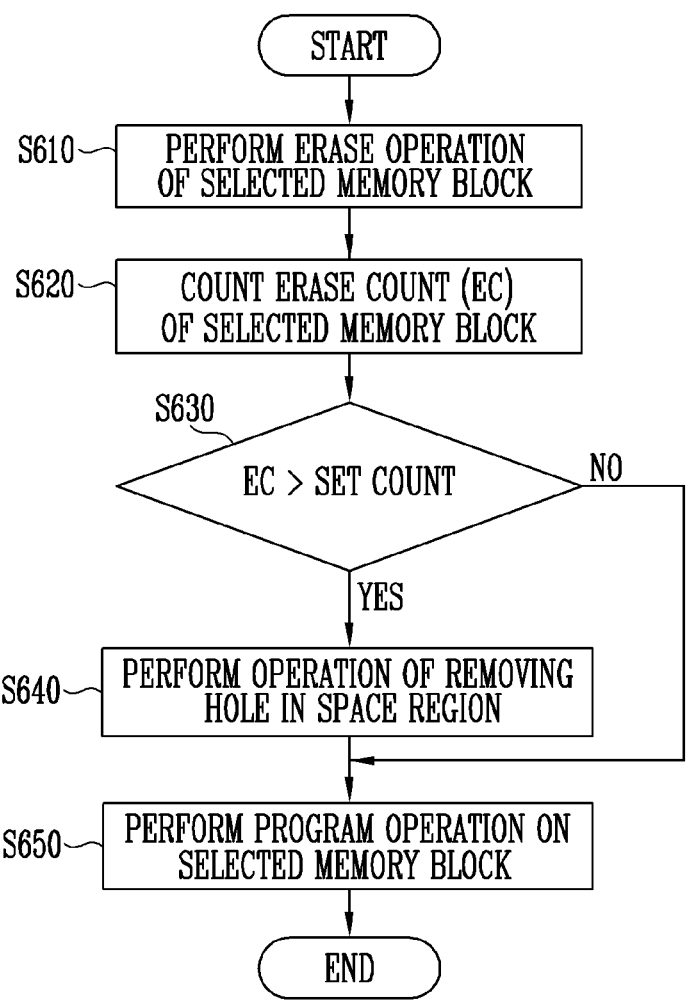
FIGS. 6 and 7 are flowcharts illustrating a method of operating a storage device according to an embodiment.
Figure 7:
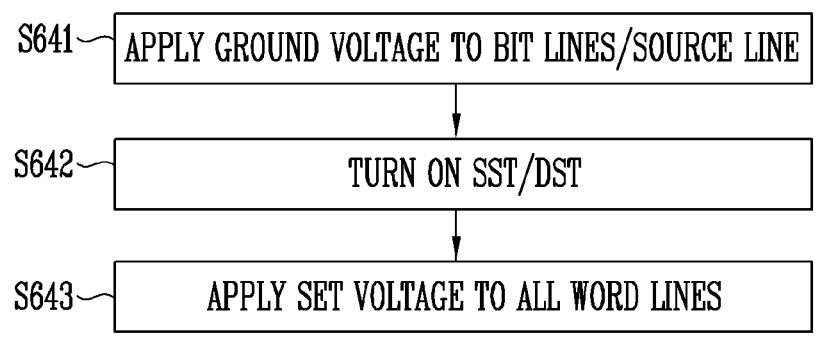

FIGS. 6 and 7 are flowcharts illustrating a method of operating a storage device according to an embodiment.

A method of operating a storage device according to an embodiment is described below with reference to FIGS. 1 to 7.

At step S610, an erase operation of a selected memory block may be performed. For example, the controller 1200 may control the semiconductor memory device 100 which is selected from among the plurality of semiconductor memory devices 100 to perform the erase operation on the selected memory block of the selected semiconductor memory device 100 in response to the host command Host_CMD. For example, the selected semiconductor memory device 100 may apply an erase voltage to the source line SL coupled to the selected memory block and apply a ground voltage to word lines of the selected memory block to perform the erase operation.

At step S620, the erase counter 1210 may count an erase count of the selected memory block on which the erase operation is performed. The erase counter 1210 may count and manage an erase count of each of all memory blocks included in the plurality of semiconductor memory devices 100 included in the memory device 1100.

At step S630, the controller 1200 may compare an erase count EC of each of the memory blocks with a set count.

As step S640, an operation of removing a hole in a space region may be performed on a memory block for which the counted erase count EC is greater than the set count.

For example, the controller 1200 may compare the counted erase count EC of each of the memory blocks with the set count and control the semiconductor memory device 100 to perform the operation of removing a hole in the space region on a memory block for which the counted erase count EC is greater than the set count.

The semiconductor memory device 100 may perform the operation of removing the hole in the space region on the memory block for which the counted erase count EC is greater than the set count in response to control of the controller 1200.

This is described in more detail below with reference to FIG. 7.

At step S641, a ground voltage may be applied to the bit lines BL1 to BL$m$ or the source line SL of a target memory block, that is, the memory block for which the counted erase count EC is greater than the set count.

At step S642, the source select transistor SST or the drain select transistor DST of the target memory block may be turned on. In other words, the source select transistor SST or the drain select transistor DST may be turned on by applying a power voltage to the source select line SSL or the drain select line DSL of the target memory block.

At step S643, a set voltage may be applied to all word lines WL of the target memory block. The set voltage may be a voltage having the same potential as a program voltage applied to a selected word line during a program operation.

Electrons may be injected into a space region between memory cells included in the target memory block by the set voltage applied to all word lines WL. Thereby, holes present in the space region may be removed.

Referring back to FIG. 6, at step S650, a program operation on the selected memory block may be performed when it is determined that there is no memory block for which the erase count EC is greater than the set count at step S630 or when the operation of removing the hole in the space region is completed at step S640.

For example, the controller 1200 may control the semiconductor memory device 100 which is selected from among the plurality of semiconductor memory devices 100 to perform the program operation on the selected memory block of the selected semiconductor memory device 100 in response to the host command Host_CMD. The selected semiconductor memory device 100 may perform the program operation on the selected memory block.

For example, when the selected memory block is a memory block on which the operation of removing a hole in the space region is performed as an immediately preceding operation, the program operation may be performed after the holes in the space region between the memory cells are removed. Accordingly, retention characteristics of the semiconductor memory device may be improved.

At step S650 described above, when the selected memory block is the memory block on which the operation of removing the hole in the space region is performed as the immediately preceding operation, it is preferable to perform the program operation after the erase operation for removing the electrons injected into a memory layer of the memory cells is performed.

Figure 8:
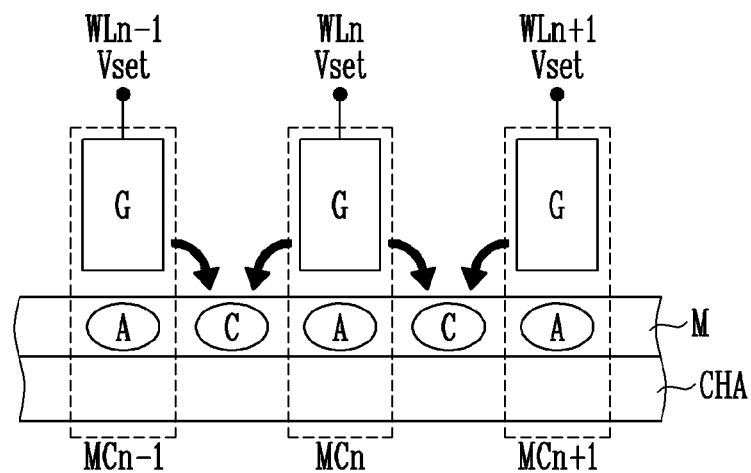
FIG. 8 is a mimetic diagram illustrating an operation of removing a hole in a space region according to an embodiment.

FIG. 8 is a mimetic diagram illustrating an operation of removing a hole in a space region according to an embodiment.

Referring to FIG. 8, each of memory cells MCn−1, MCn, and MCn+1 may include a channel layer CHA, a memory layer M, and a gate electrode G. The memory layer M may be for storing data and include a tunnel insulating layer, a data storage layer, and a charge blocking layer, or at least one of the tunnel insulating layer, the data storage layer, and the charge blocking layer. The data storage layer may include a floating gate, a charge trapping material, polysilicon, a nitride, a variable resistance material, and the like.

The gate electrodes G for the memory cells MCn−1, MCn, and MCn+1 may be electrically coupled to the word lines WLn−1, WLn, and WLn+1, respectively. In addition, the word lines WLn−1, WLn, and WLn+1 may be located in the same level or in different levels from each other.

The memory cells MC adjacent to each other may share a memory layer. For example, the memory cells MC adjacent to each other may share a tunnel insulating layer, a data storage layer, and a charge blocking layer, or at least one of the tunnel insulating layer, the data storage layer, and the charge blocking layer. Accordingly, the memory layer M may include channel regions (A) corresponding to the memory cells MC and space regions (C) located between the memory cells MC adjacent to each other. For example, the memory layer M may include channel regions (A) and space regions (C) that are alternately arranged with each other.

A set voltage Vset may be applied to all of the word lines WLn−1, WLn, and WLn+1 of a selected memory block during an operation of removing a hole in the space region. Thereby, electrons may be injected into the channel regions of the memory cells MCn−1, MCn, and MCn+1 (A).

In addition, a strong fringe field may be generated due to the set voltage Vset that is applied to all of the word lines WLn−1, WLn, and WLn+1. Thereby, electrons may be sufficiently injected into the sapce region between all of the memory cells MCn−1, MCn, and MCn+1 (C). Accordingly, the hole in the space region may be sufficiently removed.

Figure 9:
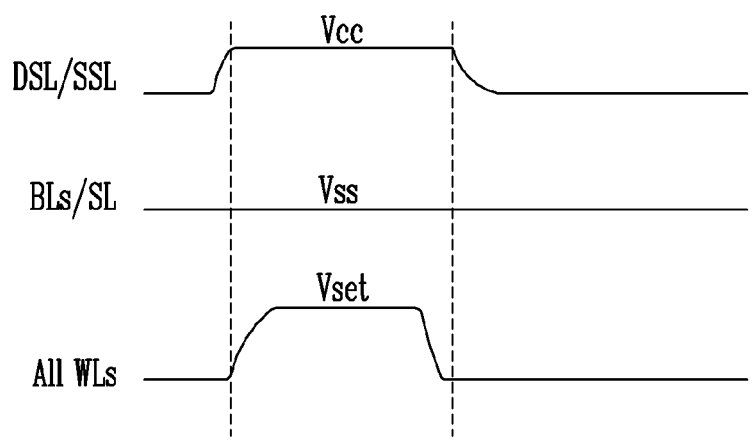
FIG. 9 is a timing diagram of signals illustrating an operation of removing a hole in a space region according to an embodiment.

FIG. 9 is a timing diagram of signals illustrating an operation of removing a hole in a space region according to an embodiment.

Referring to FIG. 9, a ground voltage Vss may be applied to bit lines BLs or the source line SL of a target memory block on which the operation of removing the hole in the space region is performed. Subsequently, the drain select transistor DST or the source select transistor SST of the target memory block may be turned on by applying a power voltage Vcc to the drain select line DSL or the source select line SSL of the target memory block. Subsequently, when the set voltage Vset is applied to all of word lines WLs of the target memory block, electrons may be injected into a space region between all memory cells included in the target memory block, thereby effectively removing holes.

According to above-described embodiment, it is described that the ground voltage Vss is applied to the bit lines BLs or the source line SL and the drain select transistor DST or the source select transistor SST are turned on. However, according to another embodiment, the ground voltage Vss may be applied to the bit lines BLs and the source line SL, and the drain select transistor DST and the source select transistor SST are simultaneously turned on, thereby performing an operation of removing a hole in a space region.

Figure 10:
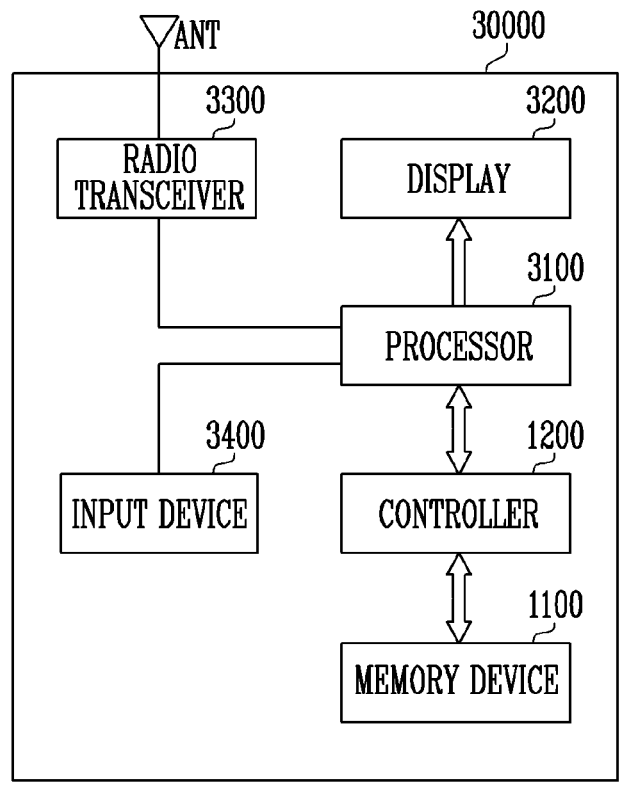
FIG. 10 is a diagram illustrating another embodiment of a memory system.

FIG. 10 is a diagram illustrating another embodiment of a memory system.

Referring to FIG. 10, a memory system 30000 may be provided as a cellular phone, a smartphone, a tablet PC, a personal digital assistant (PDA), or a wireless communication device. The memory system 30000 may include the memory device 1100 and the controller 1200 capable of controlling the operations of the memory device 1100. The controller 1200 may control a data access operation of the memory device 1100, for example, a program operation, an erase operation, or a read operation in response to control of a processor 3100.

The controller 1200 may control data programmed into the memory device 1100 to be output through a display 3200 in response to the control of the controller 1200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transmit the processed signal to the controller 1200 or the display 3200. The controller 1200 may program the signal processed by the processor 3100 into the memory device 1100. In addition, the radio transceiver 3300 may change a signal output from the processor 3100 to a radio signal and output the radio signal to an external device through the antenna ANT. A control signal for controlling operations of the processor 3100 or data to be processed by the processor 3100 may be input by an input device 3400, and the input device 3400 may include a pointing device, such as a touch pad and a computer mouse, a keypad, or a keyboard. The processor 3100 may control operations of the display 3200 so that the data output from the controller 1200, the data output from the radio transceiver 3300, or the data output from the input device 3400 may be displayed on the display 3200.

According to an embodiment, the controller 1200 capable of controlling the operations of the memory device 1100 may be formed as a part of the processor 3100, or a separate chip from the processor 3100.

Figure 11:
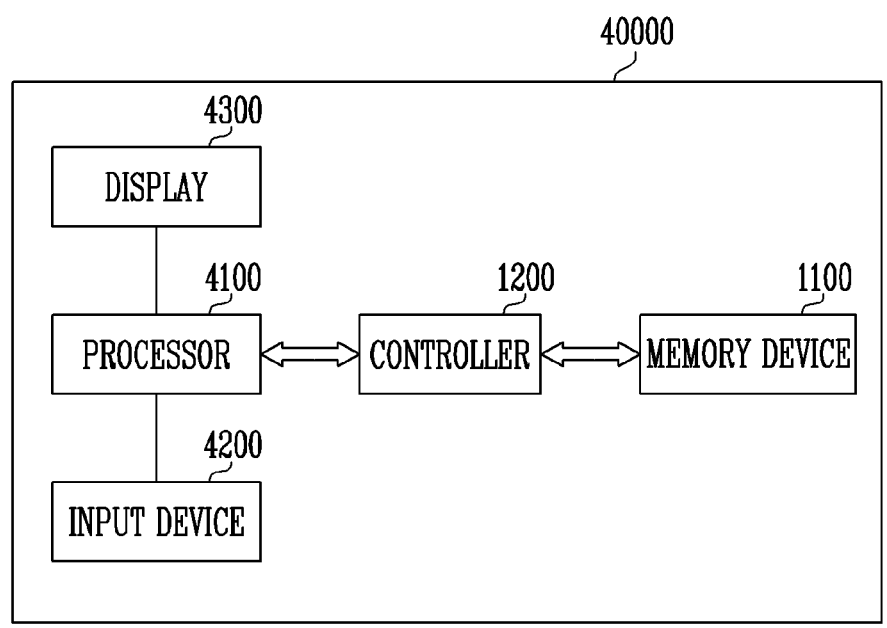
FIG. 11 is a diagram illustrating another embodiment of a memory system.

FIG. 11 is a diagram illustrating another embodiment of a memory system.

Referring to FIG. 11, a memory system 40000 may be provided as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 capable of controlling data processing operations of the memory device 1100.

A processor 4100 may output data stored in the memory device 1100 through a display 4300 according to data input through an input device 4200. For example, the input device 4200 may include a pointing device, such as a touch pad or a computer mouse, a keypad, or a keyboard.

The processor 4100 may control general operations of the memory system 40000 and control operations of the controller 1200. According to an embodiment, the controller 1200 capable of controlling the operations of the memory device 1100 may be formed as a part of the processor 4100, or a separate chip from the processor 4100.

Figure 12:
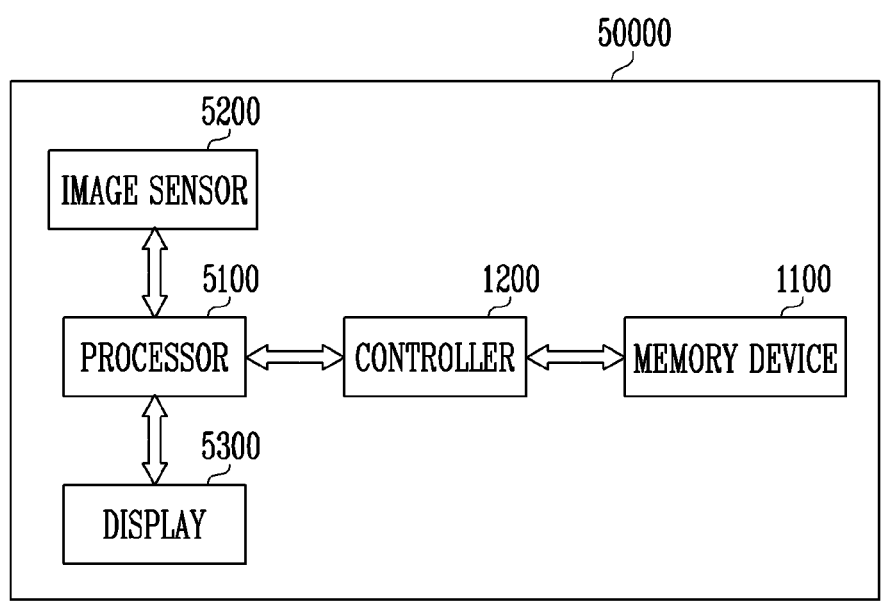
FIG. 12 is a diagram illustrating another embodiment of a memory system.

FIG. 12 is a diagram illustrating another embodiment of a memory system.

Referring to FIG. 12, a memory system 50000 may be provided as an image processor, for example, a digital camera, a cellular phone with a digital camera attached thereto, a smartphone with a digital camera attached thereto, or a tablet PC with a digital camera attached thereto.

The memory system 50000 may include the memory device 1100 and the controller 1200 capable of controlling the data processing operations of the memory device 1100, for example, a program operation, an erase operation, or a read operation.

An image sensor 5200 of the memory system 50000 may convert an optical image into digital signals, and the digital signals may be transmitted to a processor 5100 or the controller 1200. In response to control of the processor 5100, the digital signals may be output through a display 5300 or stored in the memory device 1100 through the controller 1200. In addition, the data stored in the memory device 1100 may be output through the display 5300 according to the control of the processor 5100 or the controller 1200.

According to an embodiment, the controller 1200 capable of controlling the operations of the memory device 1100 may be formed as a part of the processor 5100, or a separate chip from the processor 5100.

Figure 13:
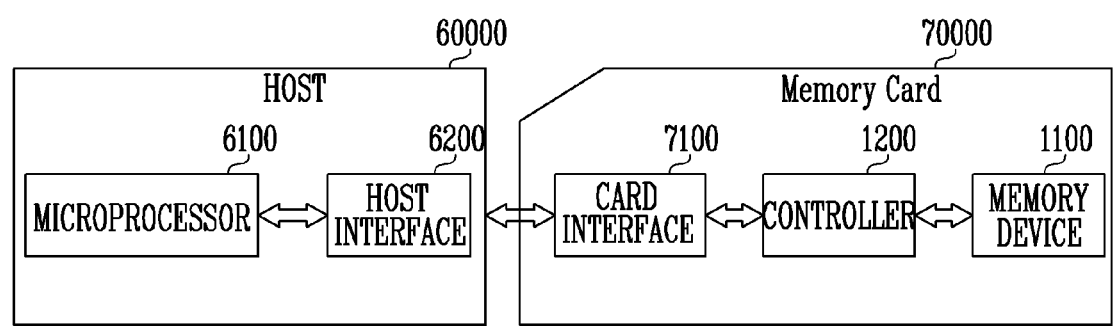
FIG. 13 is a diagram illustrating another embodiment of a memory system.

FIG. 13 is a diagram illustrating another embodiment of a memory system.

Referring to FIG. 13, a memory system 70000 may be provided as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be, but is not limited to, a secure digital (SD) card interface or a multi-media card (MMC) interface. In addition, the controller 1200 may be formed through an example of the controller 1200 shown in FIG. 1.

The card interface 7100 may interface data exchange between a host 60000 and the controller 1200 according to a protocol of the host 60000. According to an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 in response to control of a microprocessor 6100.

According to embodiments of the present disclosure, holes present in a region between memory cells may be removed. Accordingly, threshold voltage characteristics of the memory cells may be improved and reliability of the memory cells may be increased.

What is claimed is:

1. A memory system, comprising:
a plurality of semiconductor memory devices each of which includes a plurality of memory blocks; and
a controller configured to control the plurality of semiconductor memory devices to perform a program operation, a read operation, and an operation of removing a hole in a space region on a target memory block of the plurality of memory blocks,
wherein the controller controls the plurality of semiconductor memory devices to perform the operation of removing the hole in the space region on the target memory block when an erase count of the target memory block is greater than a set value.

2. The memory system of claim 1, wherein the controller includes an erase counter that counts and manages the erase count of each of the plurality of memory blocks.

3. The memory system of claim 1, wherein the plurality of semiconductor memory devices apply a set voltage to all word lines of the target memory block for which the erase count is greater than the set value during the operation of removing the hole in the space region.

4. The memory system of claim 3, wherein the plurality of semiconductor memory devices apply a ground voltage to bit lines or a source line of the target memory block during the operation of removing the hole in the space region.

5. The memory system of claim 3, wherein the plurality of semiconductor memory devices turn on source select transistors or drain select transistors included in the target memory block during the operation of removing the hole in the space region.

6. The memory system of claim 3, wherein the set voltage has a same potential level as a program voltage used to perform the program operation.

7. A memory system, comprising:
a memory device including a plurality of memory blocks; and
a controller configured to control the memory device to perform a program operation, a read operation, and an operation of removing a hole in a space region on the plurality of memory blocks,
wherein the controller includes an erase counter for counting an erase count of each of the plurality of memory blocks and controls the memory device to perform the operation of removing the hole in the space region on a target memory block for which the erase count counted by the erase counter is greater than a set value.

8. The memory system of claim 7, wherein the memory device applies a set voltage to all word lines of the target memory block during the operation of removing the hole in the space region.

9. The memory system of claim 8, wherein the set voltage has a same potential level as a program voltage used to perform the program operation.

10. The memory system of claim 8, wherein the memory device applies a ground voltage to bit lines or a source line of the target memory block during the operation of removing the hole in the space region.

11. The memory system of claim 8, wherein the memory device turns on source select transistors or drain select transistors included in the target memory block during the operation of removing the hole in the space region.

12. A method of operating a memory system, the method comprising:
- counting an erase count for each memory block of a plurality of memory blocks;
- designating, as a target memory block, a memory block among the plurality of memory blocks for which the counted erase count is greater than a set value; and
- performing an operation of removing a hole in a space region on the target memory block.

13. The method of claim 12, wherein performing the operation of removing the hole in the space region comprises applying a set voltage to all word lines of the target memory block.

14. The method of claim 13, wherein the set voltage has a same potential level as a program voltage that is applied to a selected word line during a program operation.

15. The method of claim 13, wherein performing the operation of removing the hole in the space region comprises applying a ground voltage to bit lines or a source line of the target memory block.

16. The method of claim 13, wherein performing the operation of removing the hole in the space region comprises turning on source select transistors or drain select transistors included in the target memory block.

\* \* \* \* \*